United States Patent [19]

Graf et al.

[11] Patent Number: 4,517,661

[45] Date of Patent: May 14, 1985

[54] PROGRAMMABLE CHIP TESTER HAVING PLURAL PIN UNIT BUFFERS WHICH EACH STORE SUFFICIENT TEST DATA FOR INDEPENDENT OPERATIONS BY EACH PIN UNIT

[75] Inventors: Matthew C. Graf; Hans P. Muhlfeld, Jr., both of Highland; Edward H. Valentine, Wappingers Falls, all of N.Y.

[73] Assignee: International Business Machines Corporation, Armonk, N.Y.

[21] Appl. No.: 283,778

[22] Filed: Jul. 16, 1981

[51] Int. Cl.³ .................... G06F 11/00; G01R 31/28
[52] U.S. Cl. ...................................... 364/900; 371/16; 371/20; 371/27; 324/73 R; 324/73 PC; 324/73 AT; 364/481; 364/490
[58] Field of Search ... 364/200 MS File, 900 MS File, 364/481, 490; 371/20, 21, 16, 27, 25; 324/73 R, 73 AT, 73 PC

[56] References Cited

U.S. PATENT DOCUMENTS

| 4,125,763 | 11/1978 | Drabing et al. | 371/20 |
|---|---|---|---|
| 4,168,796 | 9/1979 | Fulks et al. | 371/20 |
| 4,196,386 | 4/1980 | Phelps | 324/73 PC |
| 4,216,539 | 8/1980 | Raymond | 324/73 R |
| 4,339,819 | 7/1982 | Jacobson | 371/16 |
| 4,348,759 | 9/1982 | Schnurmann | 371/20 |
| 4,354,268 | 10/1982 | Michel et al. | 371/20 |
| 4,365,334 | 12/1982 | Smith et al. | 371/27 |
| 4,370,728 | 1/1983 | Coffron | 364/900 |
| 4,380,070 | 4/1983 | Steiner | 371/20 |
| 4,402,055 | 8/1983 | Lloyd et al. | 364/579 |
| 4,433,414 | 2/1984 | Carey | 371/27 |
| 4,439,858 | 3/1984 | Petersen | 371/20 |
| 4,450,560 | 5/1984 | Conner | 371/25 |
| 4,451,918 | 5/1984 | Gillette | 371/27 |

Primary Examiner—James D. Thomas
Assistant Examiner—A. E. Williams, Jr.
Attorney, Agent, or Firm—Edward W. Brown

[57] ABSTRACT

A test system for testing circuits in integrated circuit chips includes a host computer for controlling the test system, and a plurality of blocks operable in parallel and each including a controller, storage for test programs and test data, and plurality of electronic units or pin electronics cards, one unit being associated with one of the pins of a device under test. Each of the electronic units include timing circuitry for timing its associated pin independent of the timing of any other electronics unit.

9 Claims, 14 Drawing Figures

PROGRAMMABLE CHIP TESTER HAVING PLURAL PIN UNIT BUFFERS WHICH EACH STORE SUFFICIENT TEST DATA FOR INDEPENDENT OPERATIONS BY EACH PIN UNIT

BACKGROUND OF THE INVENTION

1. Field of the Invention

This invention relates to a system for testing digital circuits and, more particularly, relates to a system for high speed testing of both integrated logic and array circuits.

2. Description of the Prior Art

The testing of electrical characteristics of integrated circuits is of prime importance in the manufacture of electronic devices, especially for use in data processing equipment which requires extremely high reliability. Because of the large number of circuits in an integrated circuit chip, it is very desirable to test the chip or wafer during development, before releasing the chip design to manufacturing. However, the trends today in integrated circuits of increasing even more the number of circuits per chip and of merging logic and memory arrays on the same chip make testing of these chips a difficult and complex problem. As the number of circuits change, the pin count also changes and the tester must be sufficiently flexible to handle a variable pin count. Today, there exists slow speed DC testers which can handle variable pin counts, and high speed functional testers with limited and fixed pin counts. However, there is need for a combination tester (DC and functional) which will handle variable pin counts and operate in a mixed mode by testing both array and logic circuits.

SUMMARY OF THE INVENTION

Accordingly, the primary object of the present invention is to provide a tester which has the flexibility of a slow speed DC tester by being able to handle variable pin counts, and also is operable as a mixed mode high speed functional tester.

A further object of the present invention is to provide a tester with expanded pin count capability, without a degradation in testing throughput due to the increased time needed to store additional data for the expanded pins.

Another object of the present invention is to provide a tester with the ability to time each pin individually and independently.

These and other objects are achieved by the tester of the present invention which is designed with separate electronics for test data storage, test data movement and high speed test application with the electronics being divided into a plurality of blocks. Each block is self sufficient during test and operates in parallel with the other blocks, the self-sufficiency being obtained by storing and applying the test data assigned to that block. This is accomplished at a high speed rate with unique timing control on a per pin basis.

To achieve the flexibility of being able to handle variable pin counts on a high speed tester without degrading performance, the tester of the present invention is designed with local mass storage in each block sufficient to store a working days supply of test data and the necessary electronics to move that data to the high speed electronics behind each pin. As a result, the data rate to the high speed electronics increases as the tester pin requirement increases by adding additional blocks thus maintaining a fixed setup time essentially independent of the pin count.

BRIEF DESCRIPTION OF THE DRAWINGS

The invention will be best understood by reference to the following detailed description taken in conjunction with the accompanying drawings, in which.

DETAILED DESCRIPTION OF THE PREFERRED EMBODIMENT

Figure 1:
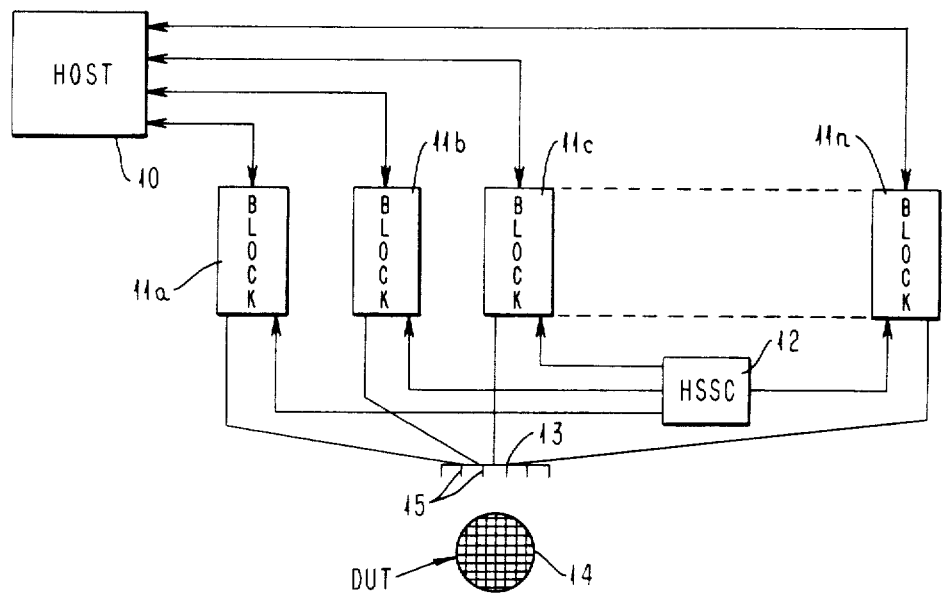
FIG. 1 is a generalized diagram of the test system of the present invention, showing the plurality of blocks.

FIG. 1 generally shows the test system of the present invention which comprises a host computer 10 a plurality of blocks 11a, 11b, 11c, 11n, a high speed system controller (HSSC) 12, a probe 13, and a device under test (DUT) 14. The host computer 10 controls the entire system and sends information to each block. Each block stores that information and controls a set of probe points 15 which will be used simultaneously to test the device 14, herein an integrated circuit chip. The HSSC 12 comprises an oscillator which, when testing the device 14, performs the function of synchronizing the test system.

Figure 2:
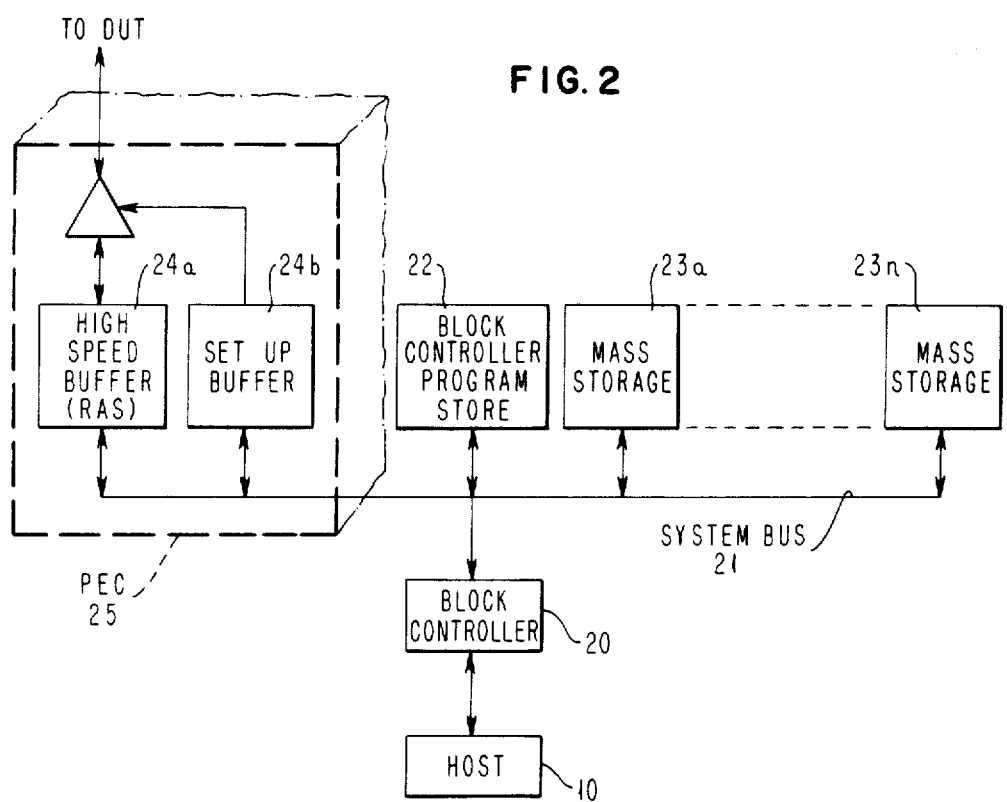
FIG. 2 is a diagram of the system configuration of a block.

Turning now to a more detailed description of one of the blocks 11 (FIG. 1), FIG. 2 shows the host computer 10 communicating with a block controller 20 of the block. The block controller 20 is connected via a system bus 21 to a block controller program store 22 and a plurality of mass storage units 23a, 23n which are expandable in 64K increments to 16 megabytes. In addition, the controller 20 is connected via the system bus 21 to high speed buffer 24a and setup buffer 24b on the *Pin Electronic Card (PEC)* 25.

Figure 3:
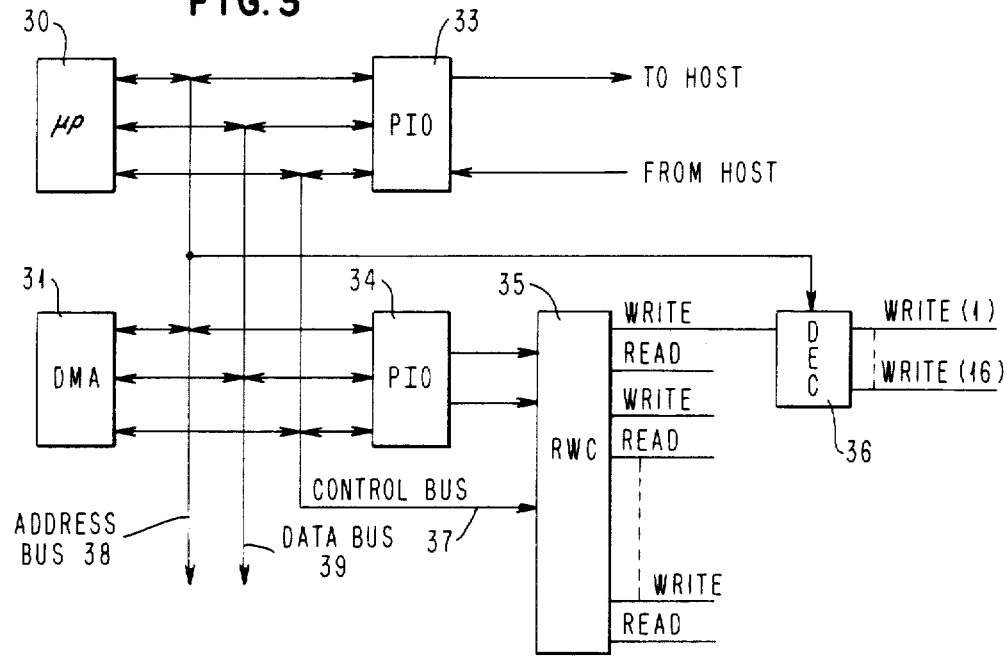
FIG. 3 is a diagram of the components of a block controller.

The details of the block controller 20 (FIG. 2) are shown in FIG. 3. The controller comprises a microprocessor 30, direct memory access unit (DMA) 31, two parallel input/output ports 33, 34, a read/write controller 35 and a decoder 36 all interconnected by a bus containing CONTROL 37, ADDRESS 38, and DATA 39 lines. All but the read/write controller 35, which will be described in more detail in connection with FIG. 4, are commercially available.

Figure 4:
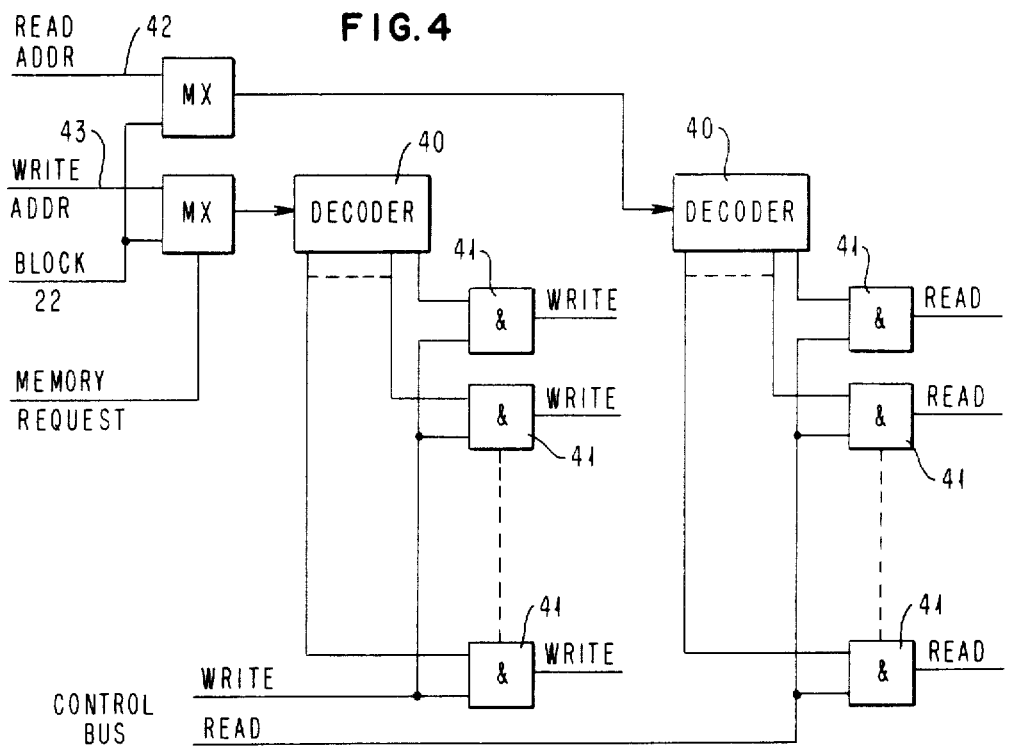
FIG. 4 is a diagram of a read/write controller.

FIG. 4 shows a more detailed look at the read/write controller 35 of FIG. 3. The microprocessor 30 (FIG. 3) will set up READ ADDRESS and the WRITE ADDRESS via the parallel input/output ports 34a, 34b. Each one of these addresses represents which block is to be the source or destination of a data transfer. The decoders 40 feed the AND circuits 41 which switch the read and write address stipulated by the parallel input/output port to address the block controller program store 22 (FIG. 2). This is done by the memory request line, which is set when the microprocessor wishes to access the block controller program store.

To cite an example how the read/write control is used to move information, reference is made to FIGS. 2 and 3. If 20,000 bytes of information are to be moved from mass storage unit 23a (FIG. 2) to the set up buffer 24b (FIG. 2) the microprocessor 30 (FIG. 3) instructs direct memory access unit 31 (FIG. 3) to move 20,000 bytes of information. Next, the microprocessor instructs the parallel input/output port 34 to set up mass storage, herein 23a, as the READ 42 address and set up buffer 24b as the WRITE address. The microprocessor 30 then instructs the direct memory access unit 31 to control the busses, whereby DMA 31 performs the move operation and then instructs the microprocessor that the job is done. At this point, the microprocessor 30 then gains control of the system bus. A block move of this type can only be accomplished via the direct memory access unit 31 which does not have control over the memory request line shown in FIG. 4. Conversely, when the microprocessor generates a read or write signal, it will always set the memory request line.

As was shown in FIG. 2 the pin electronics card 25 comprises a high speed buffer 24a and a set up buffer 24b. In addition, it includes card logic 50, which contains the high speed buffer, a phase lock loop timing block 51, and a driver and receiver block 52 as shown in FIG. 5.

In operation, the setup buffer 24b stores the information necessary to run the pin electronics card and communicate with and control the driver and receiver block 52, phase lock loop timing block 51, and the card logic block 50. The driver and receiver block 52 receives the information from the setup buffer 24b as to what voltage is defined to be a 1 or 0. The phase lock loop block 51 of FIG. 5 is commercially available, and is used to determine pulse width and position of the data being fed into the device under test, or to position the strobe (not shown) used to sample the data being received from the device under test 14. Analog signals are used to control phase lock loop block 51.

Figure 6:
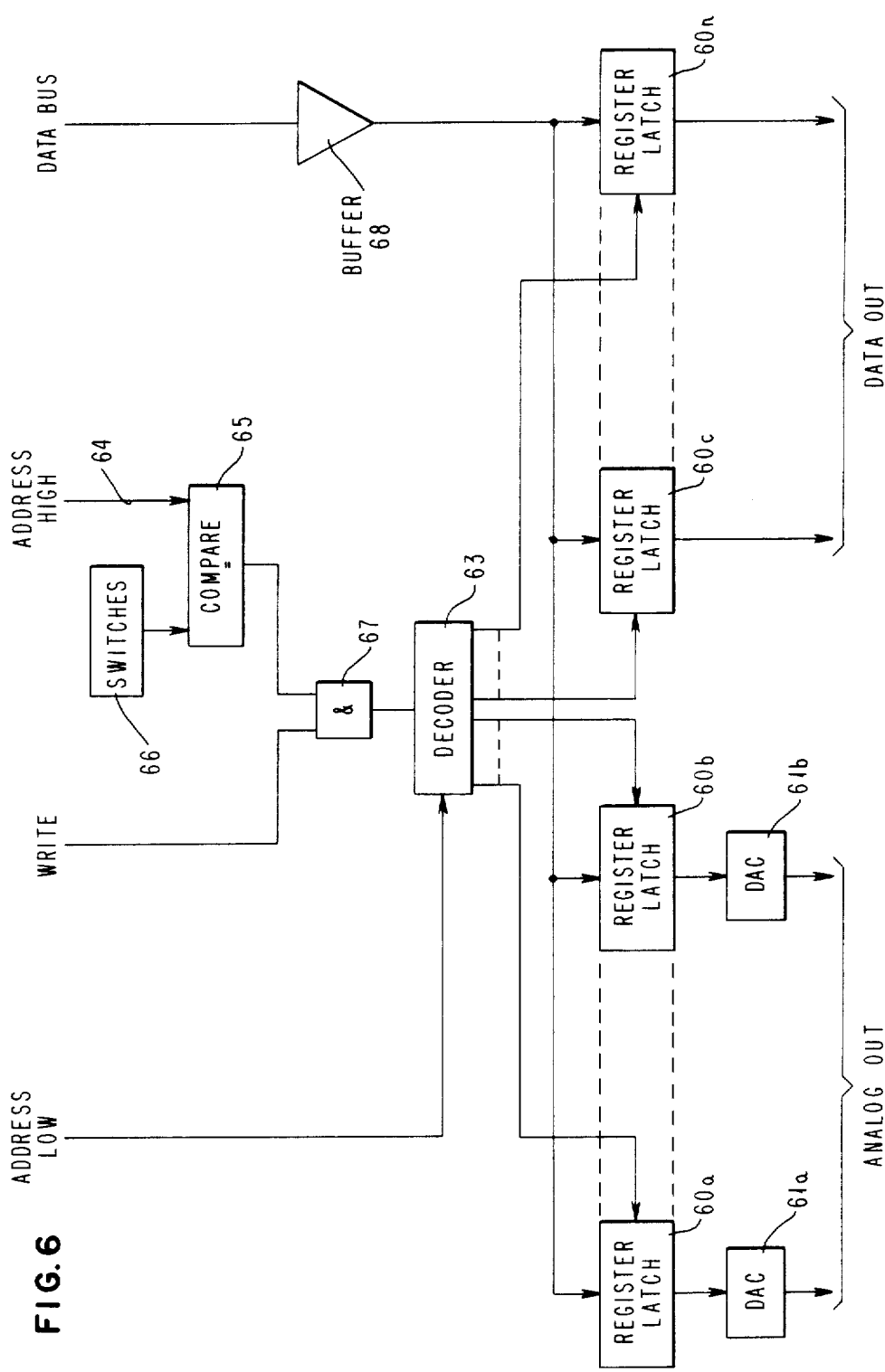
FIG. 6 is a diagram of the setup buffer of the pin electronic card.

In order for the direct memory access unit 31 (FIG. 3) of the block controller 20 (FIG. 2) to choose a particular register for writing, circuitry is provided on the set up buffer 24b (FIG. 2) which is shown in more detail in FIG. 6.

Figure 5:
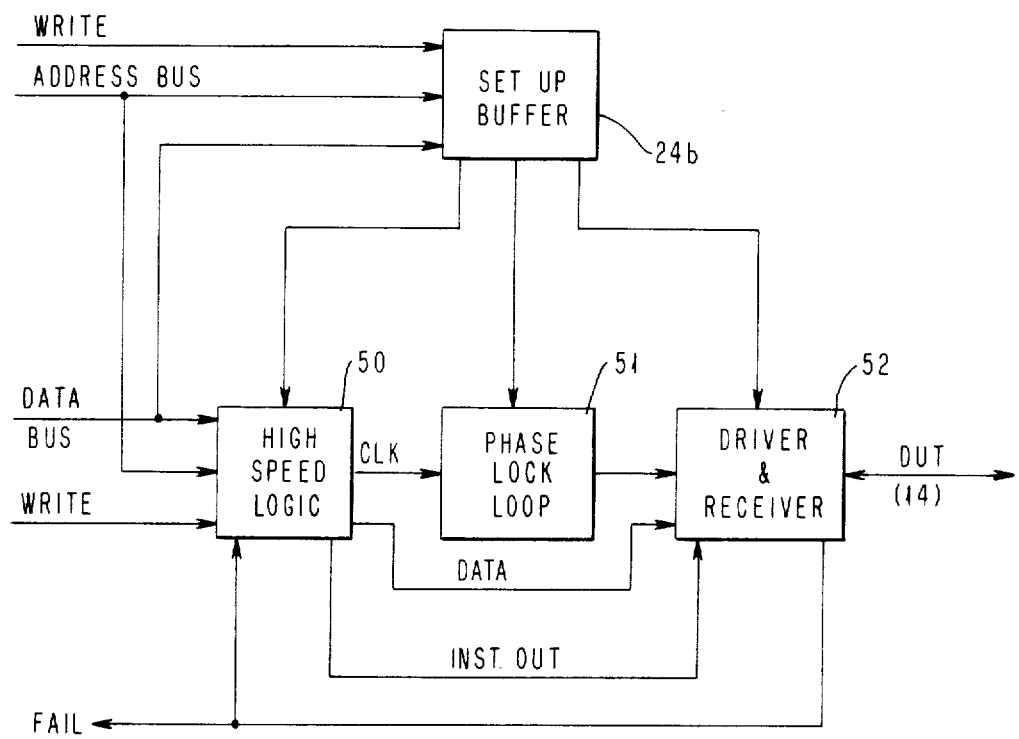
FIG. 5 is a diagram of the pin electronic card.

Essentially, the buffer comprises a plurality of different registers 60a, 60b, 60c, 60n, whose outputs either feed digital to analog converters 61a, 61b or are connected to the card logic 50 (FIG. 5). The 16 bits of the address are split into low order bits, which are fed in as ADDRESS LOW on line 62 to one of a plurality of decoders 63, and high order bits, which are fed in as ADDRESS HIGH on line 64 to comparator 65. A compare is made with an input from register identity switches 66 and the output of the comparator 65 is anded with the WRITE input in AND circuit 67 whose output is fed to decoder 63. Data from DATA BUS is buffered by buffer 68 and then distributed to the registers 60a-n along with inputs from decoder 63.

The card logic (FIG. 7) comprises address generator logic 70, selection circuitry 71, and the high speed buffer 24a (FIG. 2). Timing circuitry 72 is necessary to run the card logic which will be described in conjunction with FIG. 8. In operation, the SYSTEM RESET input, resets counter 80, the SYSTEM CLOCK input is from the oscillator in the high speed system controller 12 (FIG. 1). Register 83 and 84 are in the setup buffer 24b (FIG. 2), and are shown in this diagram for clarity. Counter 80 and register 83 and the compare circuitry 85 which they both input are used to delay the acceptance of the SYSTEM CLOCK for a number of cycles. Counter 80 counts up the cycles initiated by the SYSTEM CLOCK and register 83 stores the number of cycles the electronics card 25 (FIGS. 2 and 5) is to wait. When counter 80 equals register 83, the SYSTEM CLOCK will be gated off into counter 80 and will be allowed to propagate into the rest of the timing circuitry. The pin electronics card 25 then continues to complete the test at which point the SYSTEM CLOCK input stops.

Counter 86 feeds a multiplexer 87, which is controlled by register 84. The combination of this counter, multiplexer and register, is used to frequency divide SYSTEM CLOCK into CLOCK output 88. As an example, if the multiplexer 87 is programmed to pass port 0 0 to its output, SYSTEM CLOCK equals CLOCK output 88. If the multiplexer 87 passes port 0 1, CLOCK output 88 is at half the frequency of the SYSTEM CLOCK and so on. Port 1 0 divides the SYSTEM CLOCK by 4 and port 1 1 divides the SYSTEM CLOCK by 8. The width of the READ/WRITE output 89 is determined by the delay of the delay circuit 90 feeding the input of the AND circuit 91, the frequency of the pulse being equal to CLOCK output 88. Register 84 controls whether the READ/WRITE output was propagated or not. System clock also feeds into AND circuit 81 to provide a GATED CLOCK output 82.

Figure 7:
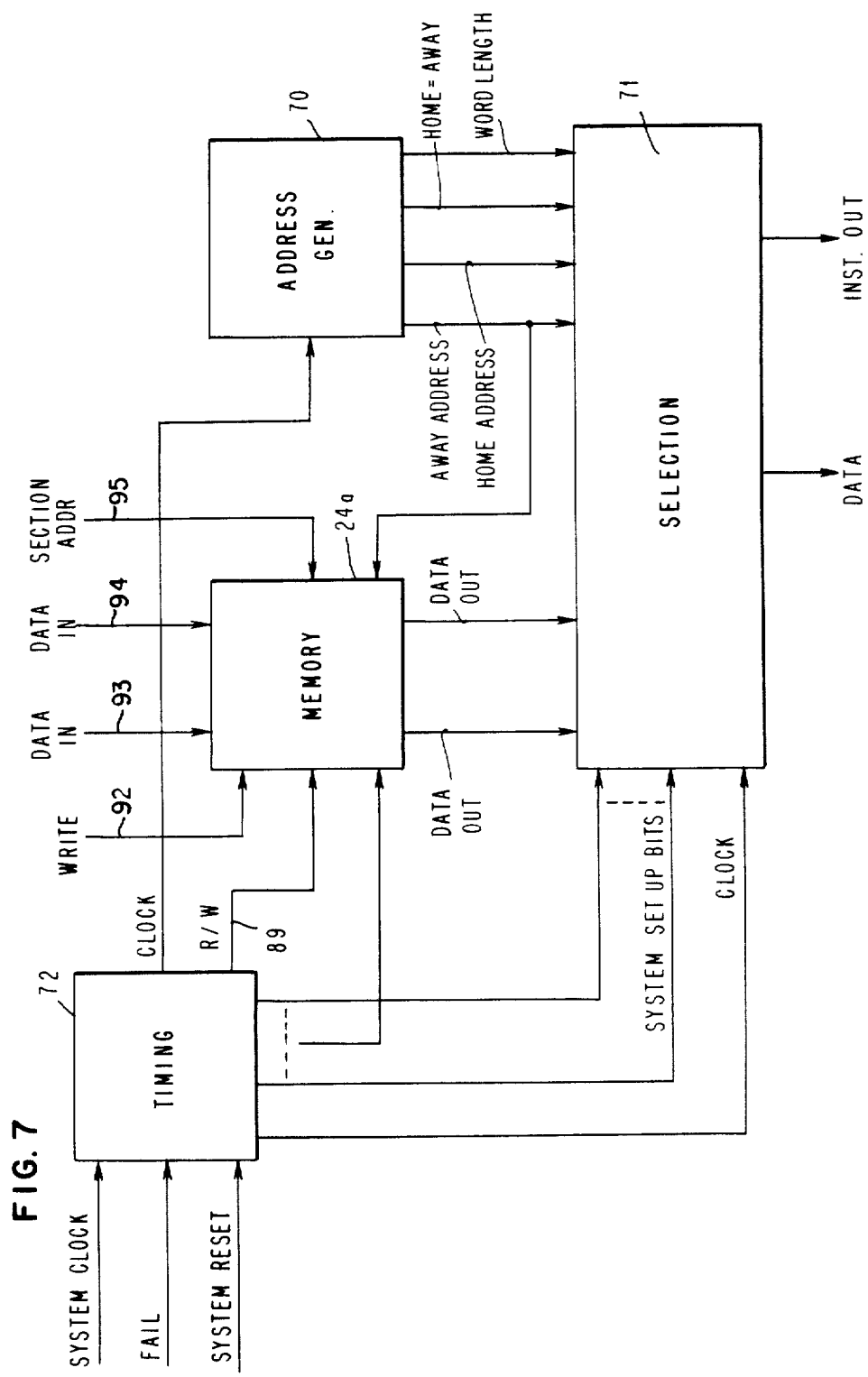
FIG. 7 is a diagram of the high speed logic of the pin electronic card.
Figure 8:
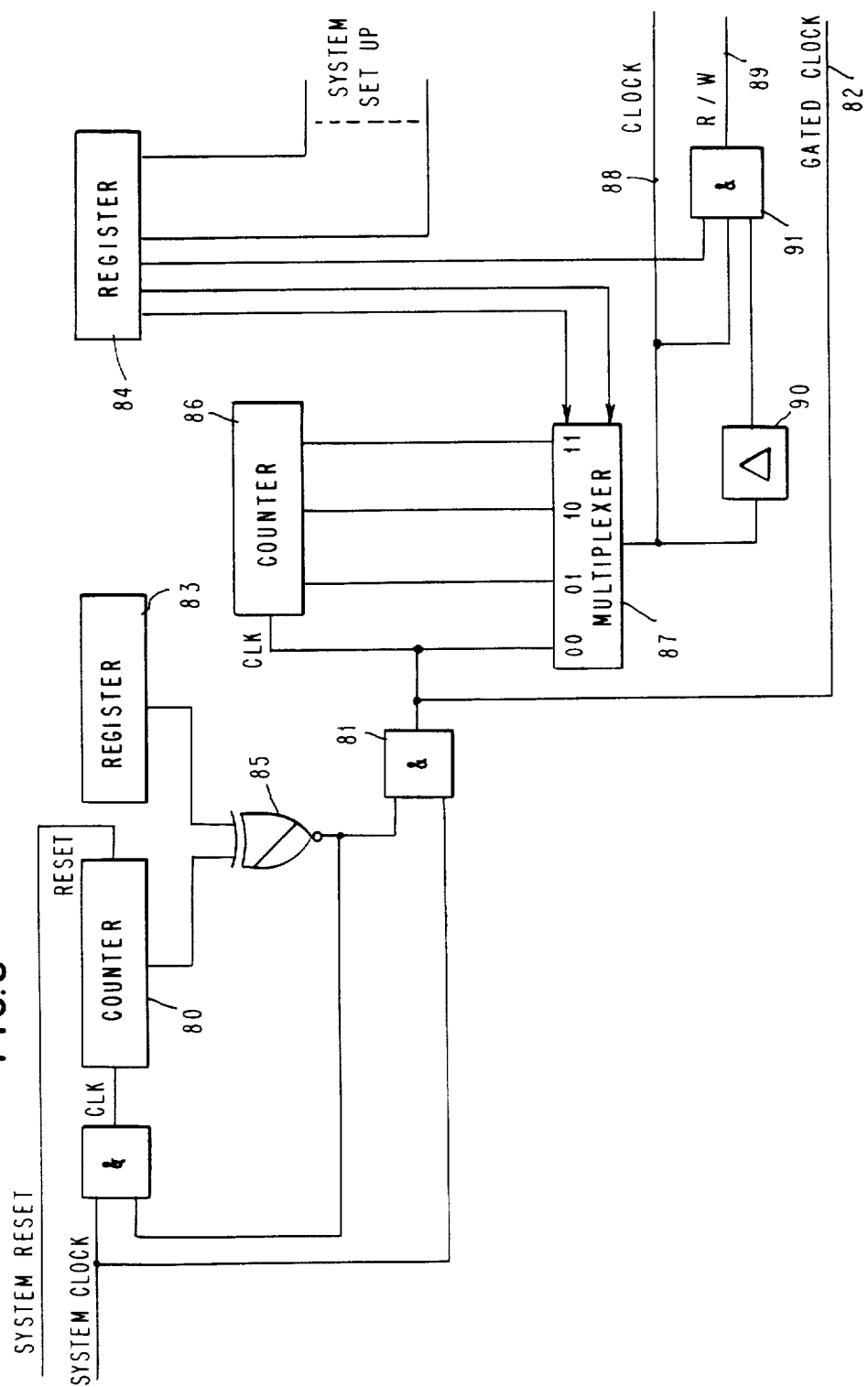
FIG. 8 is a diagram showing the timing logic in the pin electronic card.

Turning now to the memory block 24a of FIG. 7, it is fed by READ/WRITE output 89 from the timing block of FIG. 8 and the WRITE input 92, which comes from the decoder 36 (FIG. 3), two DATA IN inputs 93 and 94 from an 8 bit data bus, and a SECTION address 95 which is the low order 12 bits of the address bus. Since only two data bits from the data bus are required to feed a pin electronics card 25, (FIGS. 2 and 5) four cards are paralleled for an 8 bit bus system. If those four cards equal a section, each block supports 16 sections.

Figure 9:
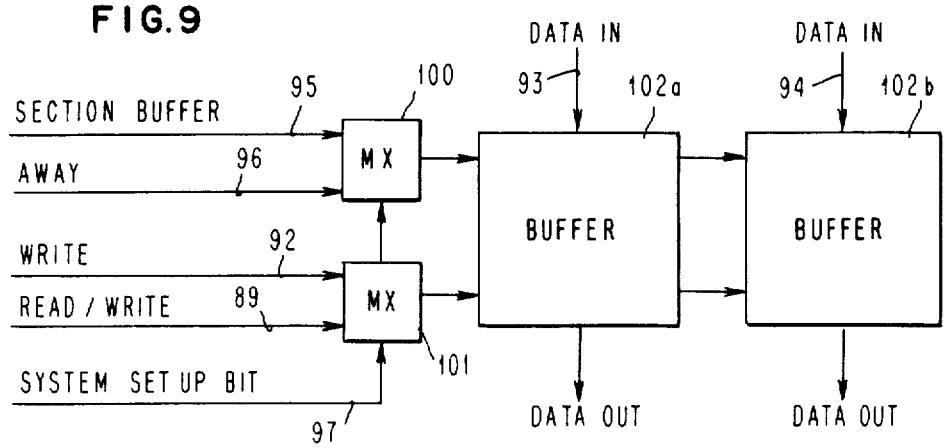
FIG. 9 is a diagram of the high speed buffer of pin electronic card.

Further details of the memory block will be understood with reference to FIG. 9. SECTION address 95 and the AWAY address 96 feed a multiplexer 100 which is controlled by a SETUP bit 97 from the setup buffer 24b (FIGS. 2 and 6). WRITE input 92 and READ/WRITE input 89 both feed a multiplexer 101 controlled by the same SETUP BIT 97 as multiplexer 100. The SETUP BIT 97 provides a path for the direct memory access to write into, herein, two 4 k×1 buffers 102a, 102b. DATA IN 93 and 94 again come from two bits of the data bus.

Figure 10:
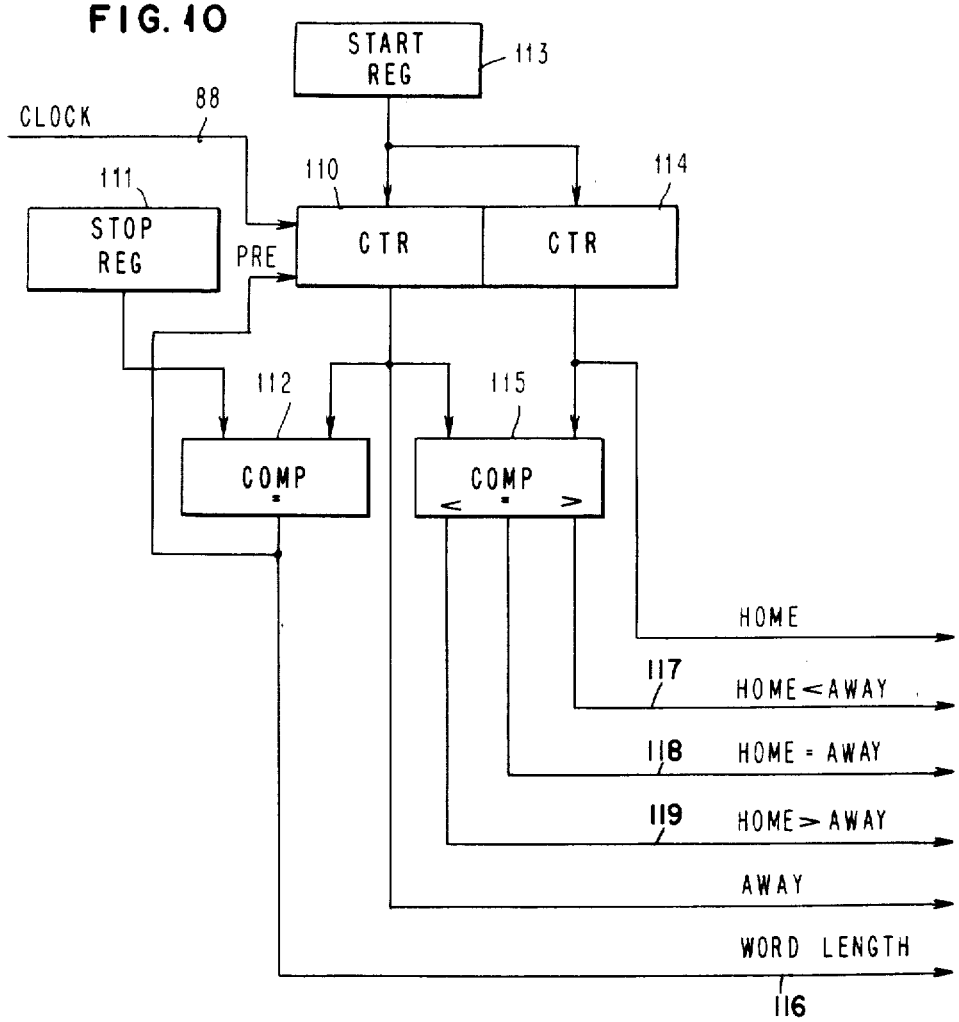
FIG. 10 is a diagram of the address generator portion of the pin electronic card.

The address generation block 70 (FIG. 7) is shown in more detail in FIG. 10. The inputs to the address generation block are CLOCK 88 and 16 bits of setup buffer information. Counter 110 and register 111, both feed compare circuitry 112. When counter 110 equals register 111, counter 110 presets to the contents of register 113. This permits pin electronics to loop within an address base. The output of counter 110 is referred to as the AWAY address, and provides the AWAY input 96 in FIG. 9. The output of the compare circuitry 112 fed by register 111 and counter 110 is called WORD LENGTH 116. Counter 110 and counter 114 are herein configured into one 32 bit counter. The output of counter 114 is called the HOME address. The output of counter 110 and counter 114 are compared using compare circuitry 115 to yield either HOME<AWAY output 117, HOME=AWAY output 118 or HOME>AWAY output 119.

Figure 11:
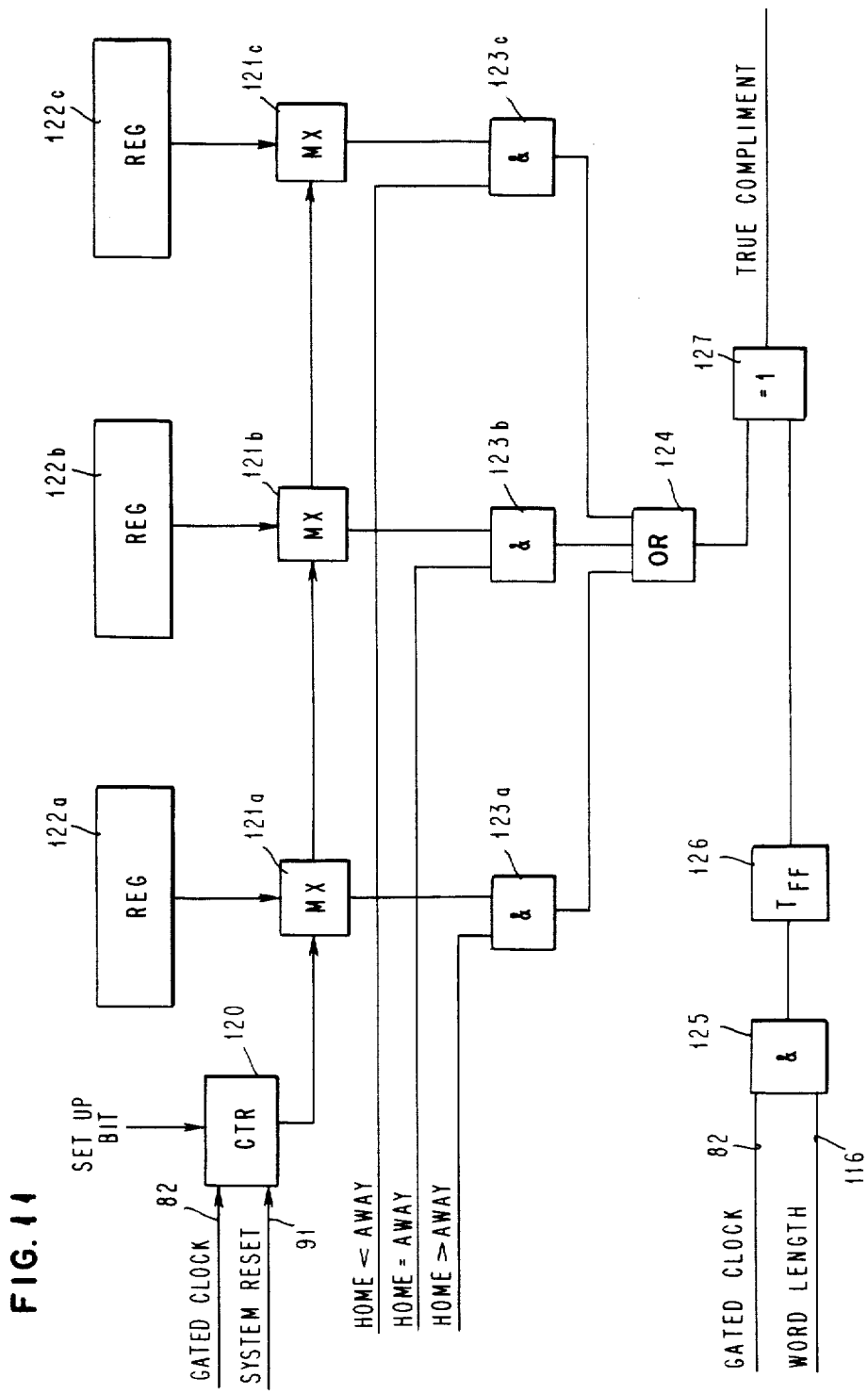
FIG. 11 is a partial diagram of the selection circuitry of the selection block of FIG. 7.
Figure 12:
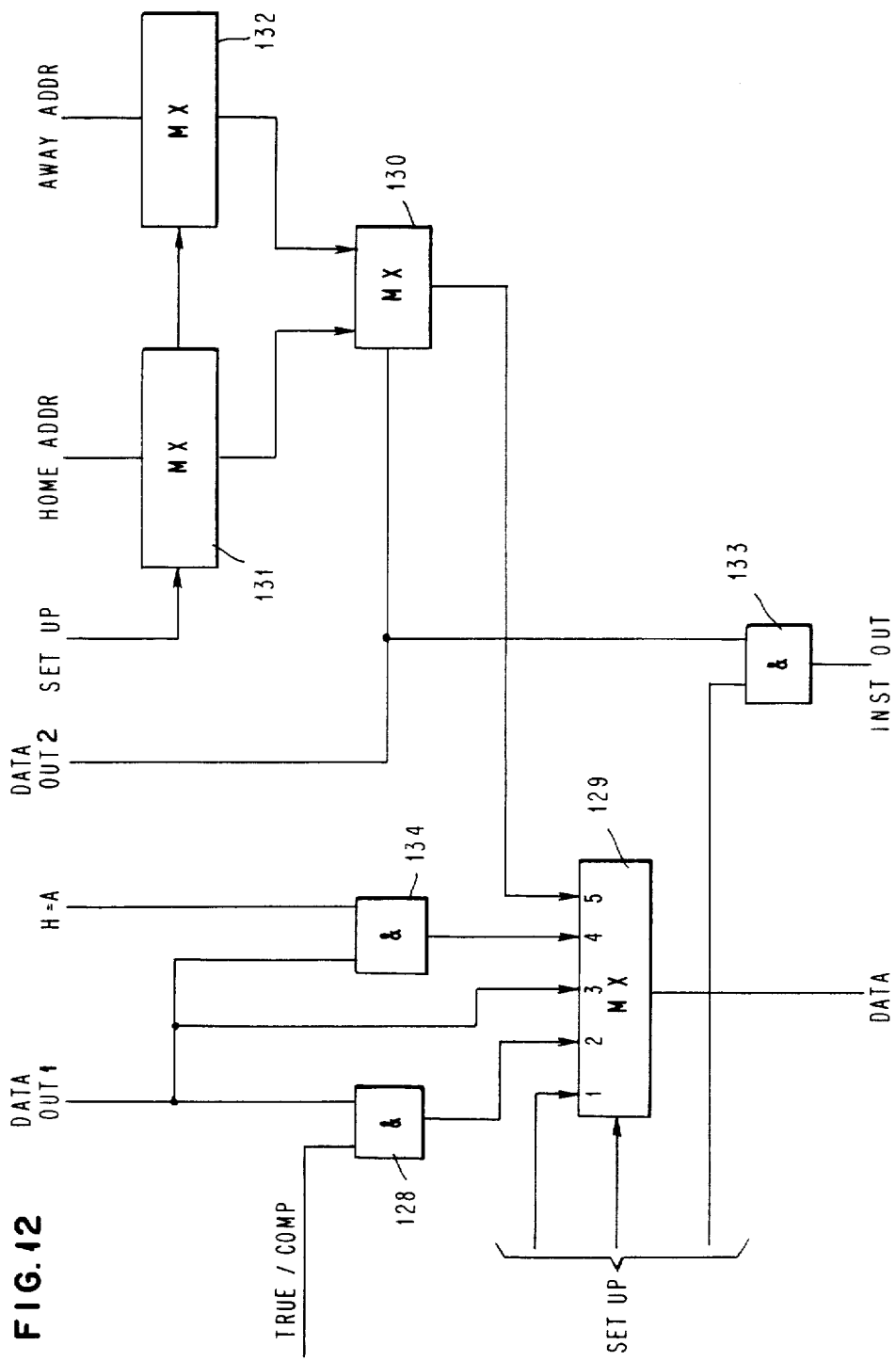
FIG. 12 is the remaining portion of the selection circuitry of the selection block of FIG. 7.

The selection block 71 (FIG. 7) is now shown in more detail in reference to FIGS. 11 and 12. As shown in FIG. 11 control of the selection circuitry is SYSTEM SETUP BITS 97 which input into counter 120 along with CLOCK 2 and SYSTEM RESET input 91. The counter 120 determines the number of steps per address in the test program and its output is fed into a series of multiplexers 121a, 121b and 121c, each of which are associated with registers 122a, 122b, 122c, respectively, which identify the sequence of TRUE/COMPLEMENT generation at specific intervals indicated by HOME/AWAY inputs. These inputs are fed to AND circuits 123a, 123b, 123c along with the outputs from multiplexer 121a, 121b, and 121c. The output of the AND circuits are fed into OR circuit 124. GATED CLOCK 82 input is ANDed with WORD LENGTH input, which identifies the size of the memory under test, in AND circuit 125 whose output feeds a toggle flip flop or complement by pass flip flop 126. The output of flip flop 126 is fed together with the output of OR circuit 124 into Exclusive OR 127 which provides a TRUE/COMPLEMENT output.

Turning to FIG. 12, the TRUE/COMPLEMENT output is fed, together with DATA OUT 1, into an Exclusive OR 128 whose output is fed into input 2 of multiplexer 129 which computes the DATA output. The computation is based on input 1-5 of multiplexer 129. Input 1 of the multiplexer receives set up bits, and input 4 is an AND function from AND circuit 134 of DATA OUT 1 and HOME=AWAY inputs. Input 3 is a direct input of DATA OUT 1.

In array testing using a ping pong pattern, multiplexer 130 is fed by a bit either from (HOME address) multiplexer 131 or (AWAY address) multiplexer 132, both of which receive a setup bit coming from setup buffer 24b (FIGS. 2 and 6). The output of multiplexer 130 is fed into input 5 of multiplexer 129. DATA OUT 2 along with a SET UP bit also inputs AND circuit 133 whose output feeds the driver and receiver logic 52 shown in FIG. 5. The INSTRUCTION OUT bit controls whether that circuitry is either driving the device under test 14 or receiving information from the device 14, and permits the use of a bidirectional channel to and from the device 14.

Figure 13:
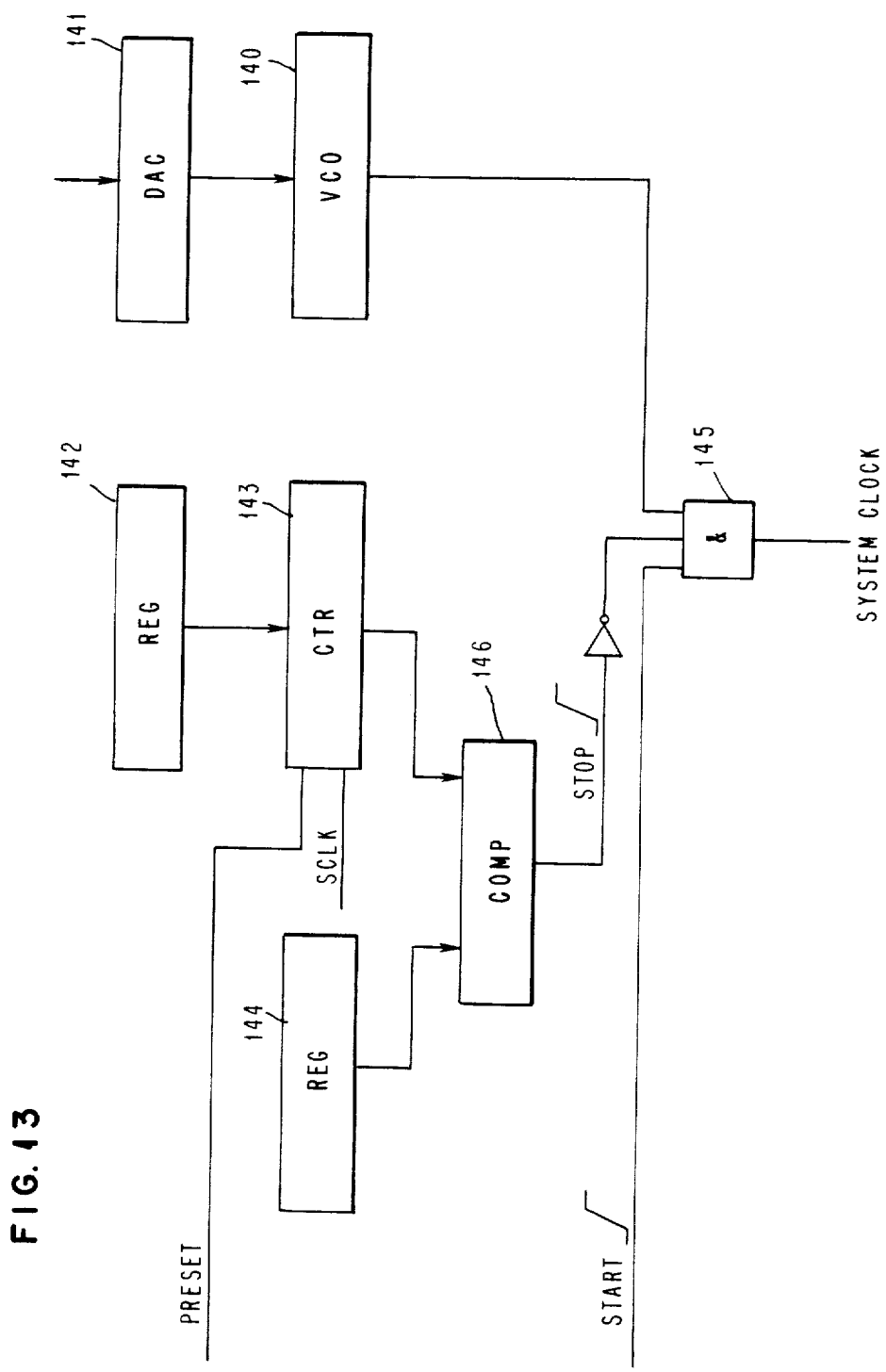
FIG. 13 is a diagram of the high speed system controller of FIG. 1.

To further understand the high speed system controller 12 (FIG. 1), a detailed discussion will now be given in conjunction with FIG. 13. A variable controlled oscillator 140, which receives an input from a digital to analog converter 141, determines the clock frequency at which all pin electronic cards 25 (FIGS. 2 and 5) will execute. Register 142 stores the counter 143 precondition, and a PRESET bit loads the precondition into the counter. Register 144 contains the number of cycles of the test. A START input into AND circuit 145 will propagate the frequency of the oscillator 140 as the SYSTEM CLOCK to all pin electronic cards 25 and to the counter 143. When the number in counter 143 equals the number of cycles in register 144 by a compare in comparator 146, a STOP signal will be fed to the AND circuit 145 and the SYSTEM CLOCK will be turned off.

To further understand the tester of the present invention, a logic and an array test will now be described. The test program, whether it be for a logic test or an array test, resides in the host computer 10 (FIG. 1). This test program is distributed to preselected blocks 11a-11n (FIG. 1) via block controllers 20 (FIG. 2 and FIG. 3). A segment test data is first stored in the block controller program store 22 and is later transferred to mass storage 23a-23n (FIG. 2) via direct memory access 31 (FIG. 3) and the read/write controller 35 (FIG. 3). In this manner, the entire test data enters mass storage. It should be recognized that the host computer 10 (FIG. 1) has been programmed with the block configuration. That is, the host computer knows how many blocks are in the tester and which block controls which pin in the device under test. Further, the analog calibration data and additional setup information is stored in mass storage 23a-23n (FIG. 2).

At the time of executing a test, the block controller 20 (FIGS. 2 and 3) instructs that the high speed buffer 24a (FIGS. 2 and 7) and the setup buffer 24b (FIGS. 2 and 6) be loaded with data values which were previously stored in mass storage 23a-23n (FIG. 2). This is achieved by the previously described memory segment move. At this point, the block controller 20 signals the host computer 10 that the preselected blocks of blocks 11a-11n (FIG. 1) are ready. Now, the high speed system controller 12 (FIG. 1) transmits via the system clock 81 (FIG. 7) a predetermined number of pulses to all pin electronic cards 25 (FIGS. 2 and 5).

Figure 14:
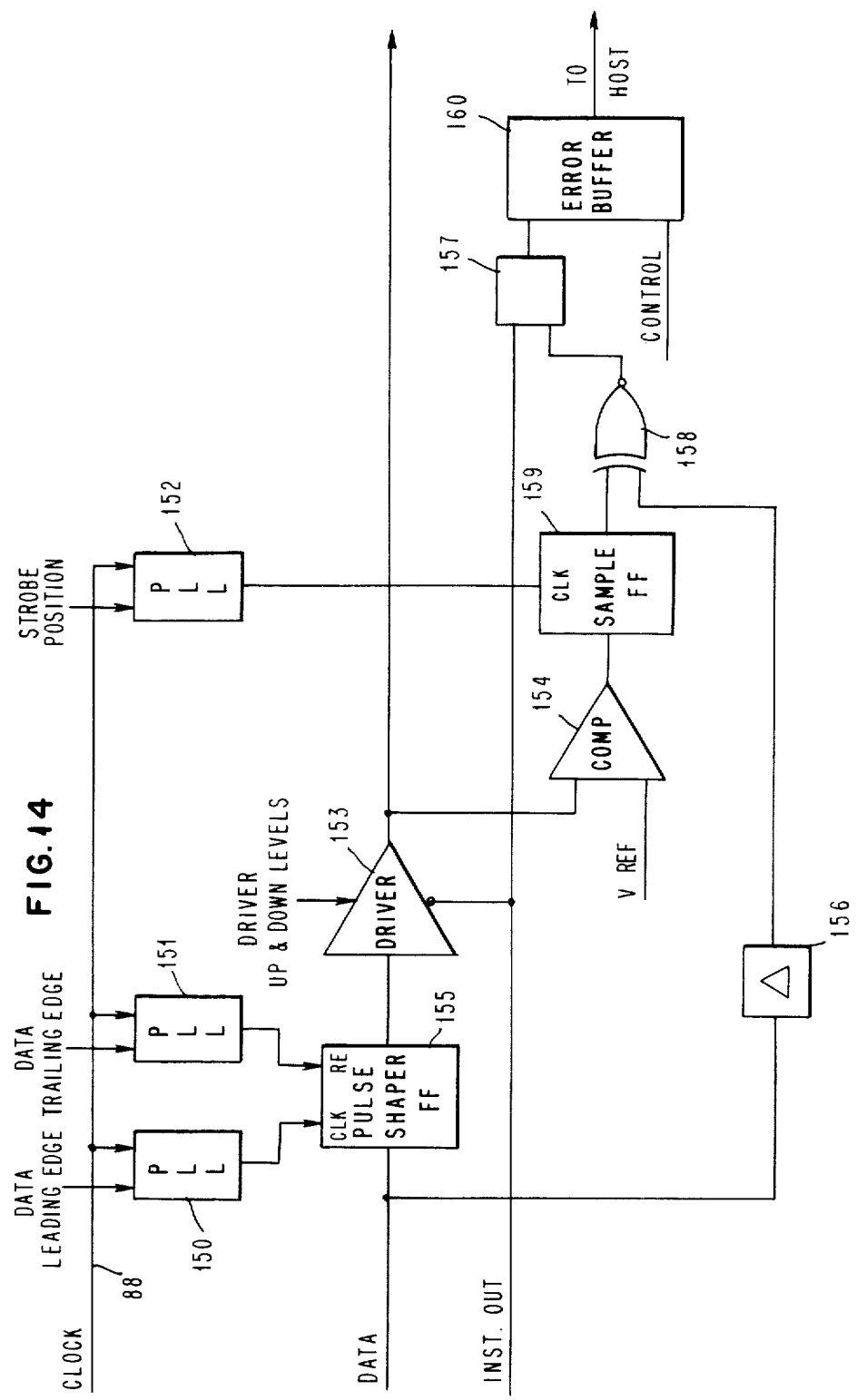
FIG. 14 is a diagram of the driver and receiver circuit of FIG. 5.

The driver and receiver block 52 (FIG. 5) is shown in greater detail in FIG. 14. Inputs comprise SET UP ANALOG signals and include DATA LEADING EDGE, DATA TRAILING EDGE, STROBE POSITION into phase lock loops 150, 151, 152 respectively, and DRIVER UP LEVEL and DRIVER DOWN LEVEL into driver 153 and V REFERENCE into comparator 154. The analog input comes from the digital to analog converter output of the setup buffer as shown in FIG. 6. The DATA LEADING and TRAILING EDGE inputs control data position and pulse width while the STROBE POSITION input determines strobe timing. DRIVER UP LEVEL and DRIVER DOWN LEVEL inputs set the pulse amplitude and offset of the driver 153. V REFERENCE input sets the reference level of comparator 154.

DATA input to flip flop or pulse shaper 155 and delay compensator 156 in FIG. 14 is from the output of multiplexer 129 (FIG. 12) and serves (1) as a data source for the driver in those pin electronic cards 25 (FIGS. 2 and 5) which are used to generate DUT 14 inputs, and (2) as a compare input in those pin electronic cards 25 which are used to receive and check DUT 14 outputs. The same pin electronic card 25 may serve both functions in a bidirectional mode. The INST. OUT input to driver 153 and AND circuit 157 is from AND circuit 133 (FIG. 12) and is used to determine whether the pin electronic card 25 (FIGS. 2 and 5) is driving or receiving at any given time. For example, when driving the FAIL output of AND circuit 157, which is an AND of the input INST. OUT and the output from comparator 158, is blocked and the driver 153 is enabled. When receiving, the FAIL output is enabled and the driver blocked or disabled. When it doesn't matter whether the pin electronic card 25 is driving or receiving, this condition is masked by INST. OUT to drive and DATA to zero so that no driver 153 output occurs and the FAIL output is disabled.

The pulse shaper 155, along with phase lock loops 150 and 151, latch the DATA input and establish its leading and trailing edge before it reaches driver 153. The driver, in turn, establishes proper up and down levels before it sends the DATA input to the DUT 14 via the probe 13 (FIG. 1). The comparator 154 compares the DUT 14 output or the driver 153 output with a reference level and feeds the results to a sample flip flop 159 where it is time sampled by the strobe (not shown) previously positioned by phase lock loop 153. The sample flip flop 159 output then is compared with a delayed DATA input in comparator 158 and the results gated by INST. OUT in AND circuit 157 whose output is fed to an error buffer 160 where it is stored. At the end of a test, the error buffers 160 on all the pin electronic cards 25 (FIGS. 2 and 5) which were used to check DUT 14 outputs are read by the host computer 10 (FIG. 1) and the results analyzed.

In performing a logic test, DATA OUT (FIG. 9) contains the logical value information for the test. DATA OUT 1 contains an instruction as to whether the pin electronic card 25 is driving to (1) or receiving from (0) the device under test 14 (FIG. 1). Counter 110 (FIG. 10) generates a sequence of addresses necessary to step through the high speed memory 24a (FIGS. 2 and 9). DATA (FIG. 12), which is gated from DATA OUT 1 via the third input to the multiplexer 129, is fed to compare circuitry of driven receiver block 52 (FIG. 5).

For testing an array, herein, a 1K RAM the addressing sequence is a commonly known ping pong pattern, the data format being complementary by pass. The test comprises the following steps:

1. All locations in the test RAM are preconditioned to 1.

(a) In pin electronic cards used for address, the setup chooses the weight of AWAY address (FIG. 12) which is gated through to DATA output;

(b) In pin electronics cards used for data the setup bits makes the DATA = 1;

(c) In pin electronics used for control lines (i.e. read/write) the setup causes DATA output to be of proper value to write.

2. Execute test (a) In pin electronic cards used for address in register 111 (FIG. 10) equals size of the RAM under test (i.e.—1K)

register 113 (FIG. 10) equals 0 multiplexer 131 and 132 (FIG. 12) are set up to proper address weight (i.e.—$2^3$) multiplexer 130 selects HOME or AWAY address under control of DATA OUT DATA OUT contains ping (HOME) or pong (AWAY) information in which four step ping pong herein comprises Read HOME address
Read AWAY address
Write HOME address
Read AWAY address (b) In pin electronic cards used for data
generation
buffer 102a (FIG. 9) is loaded with 1's;
register 111 (FIG. 10) equals size of the address of the RAM under test;
register 113 (FIG. 10) 122a, 122b and 122c (FIG. 11) equal 0;

DATA OUT (FIG. 12) is gated through input 2 of multiplexer 129;

(c) In pin electronics cards used for write control in which store the write control sequence in memory (FIG. 9) (i.e.—1,1,0,1,1,1,0,1 et seq.)

register 111 equals size of the address of the RAM;
register 113, (FIG. 10) 122a, 122b, 122c, (FIG. 11) equals 0;

(d) In pin electronics cards used for receiving and checking DATA from RAM under test;

register 113 equals size of RAM under test;
register 111 equals 0;
buffer 102a (FIG. 9) is loaded with all 1's;
counter 120 (FIG. 11) equals 3 for a four-step per address pattern;
registers 122a, 122b and 122c are loaded with a true complement pattern necessary to insure correct data polarity of the compare circuit input (FIG. 14);

DATA OUT (FIG. 12) is gated to input 2 of multiplexer 129.

While our invention has been particularly shown and described with reference to the preferred embodiment thereof, it will be understood by those skilled in the art that changes in form and detail may be made without departing from the spirit and scope of our invention.

Having thus described our invention, what we claim as new, and desire to secure by Letters Patent is:

1. A test system for testing circuits in integrated circuit chips, through the pins of the device in which the chips are mounted, by transmitting a test program of test signals and receiving output signals from the circuits, comprising:

a host computer for controlling the test system;

a plurality of electronic blocks for testing circuit, each testing block including a system bus, a controller connected to said host computer and said system bus, means for mass storage of the test program connected to said system bus, and a plurality of pin electronic units within each testing block and connected to the system bus and a predetermined pin of a device under test, each of the pin electronic units including a buffer for storing the test program for use by said pin electronic unit, said controller responsive to the host computer for controlling the transfer of the test program between said mass storage means and the buffer of each pin electronic unit, whereby each unit contains sufficient test data to operate independently of the other pin electronic units.

2. The test system of claim 1 wherein each of said thin electronic units include timing means for transmitting timing signals to its predetermined pin of a device under test independent of any other electronic unit.

3. The test system of claim 2 wherein the timing means comprises a phase lock loop.

4. The test system of claim 1 wherein said storage means in at least one of said blocks contains test data for other than the device under test, thereby increasing the throughput of the test system.

5. The test system of claim 1 wherein the storage means comprises mass storage of sufficient size for storing test data to permit continuous testing over an extended period.

6. The test system of claim 1 wherein each of said pin electronic units functions during the test to test only one pin of the device under test.

7. The test system of claim 1 wherein said pin electronic unit contains a memory bit which controls the direction of data to and from the device under test.

8. The test system of claim 1 wherein each of the electronic units of a testing block comprises high speed logic operable in a self sufficient test mode, after being initialized by the host computer, to test the circuit associated with the pin of the device to which the high speed logic is connected.

9. The test system of claim 1 wherein the system includes a clock for generating timing signals to synchronize the timing at which all pin electronic units of the testing blocks execute the test program.

* * * * *